United States Patent
Kim (10) Patent No.: US 9,570,150 B2
(45) Date of Patent: Feb. 14, 2017

(54) MEMORY DEVICE WITH OPEN BIT LINE STRUCTURE WHICH MINIMIZES LOADING DIFFERENCE OF SENSE AMPLIFIERS ARRANGED OUTERMOST PART

(71) Applicant: SK hynix Inc., Gyeonggi-do (KR)

(72) Inventor: Dong-Keun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/705,628

(22) Filed: May 6, 2015

(65) Prior Publication Data

US 2016/0163375 A1    Jun. 9, 2016

(30) Foreign Application Priority Data

Dec. 8, 2014    (KR) .......................... 10-2014-0174704

(51) Int. Cl.
| | |
|---|---|
| G11C 11/4091 | (2006.01) |
| G11C 11/4093 | (2006.01) |
| G11C 11/4094 | (2006.01) |
| G11C 5/02 | (2006.01) |
| G11C 7/02 | (2006.01) |

(52) U.S. Cl.
CPC .......... *G11C 11/4091* (2013.01); *G11C 5/025* (2013.01); *G11C 7/02* (2013.01); *G11C 11/4094* (2013.01)

(58) Field of Classification Search
CPC ...................................................... G11C 7/08
USPC ........................................................ 365/208
See application file for complete search history.

(56) References Cited

U.S. PATENT DOCUMENTS

| | | | | |
|---|---|---|---|---|
| 7,177,216 B2* | 2/2007 | Suh | .......................... | G11C 7/18 365/190 |
| 8,482,951 B2* | 7/2013 | Yi | .......................... | G11C 7/062 365/149 |
| 2007/0104006 A1* | 5/2007 | Hwang | ................ | G11C 7/1078 365/233.17 |
| 2008/0049528 A1* | 2/2008 | Yang | ........................ | G11C 7/02 365/205 |
| 2008/0074914 A1* | 3/2008 | Fang | ...................... | G11C 5/025 365/63 |
| 2008/0151664 A1* | 6/2008 | Kim | ........................ | G11C 7/065 365/205 |

(Continued)

FOREIGN PATENT DOCUMENTS

| | | |
|---|---|---|
| KR | 1020060031392 | 4/2006 |
| KR | 1020120095226 | 8/2012 |

*Primary Examiner* — Anthan Tran
*Assistant Examiner* — Mushfique Siddique
(74) *Attorney, Agent, or Firm* — IP & T Group LLP (57) ABSTRACT

A memory device may include: first to Nth cell blocks; first to (N−1)th bit line sense amplifiers, of which a Kth bit line sense amplifier amplifies a potential difference between a bit line of a Kth cell block and a bit line of a (K+1)th cell block; one or more first outermost bit line sense amplifiers suitable for amplifying a potential difference between a first node and a bit line of the first cell block, wherein drivability for driving the first node is different from drivability for driving the bit line of the first cell block; and one or more second outermost bit line sense amplifiers suitable for amplifying a potential difference between a second node and a bit line of the Nth cell block, wherein drivability for driving the second node is different from drivability for driving the bit line of the Nth cell block.

13 Claims, 10 Drawing Sheets

(56) References Cited

U.S. PATENT DOCUMENTS

2014/0003113 A1\* 1/2014 Seno .................. G11C 7/10
                                                    365/51
2014/0233336 A1\* 8/2014 Shin .................. G11C 7/065
                                                   365/205

\* cited by examiner

MEMORY DEVICE WITH OPEN BIT LINE STRUCTURE WHICH MINIMIZES LOADING DIFFERENCE OF SENSE AMPLIFIERS ARRANGED OUTERMOST PART

CROSS-REFERENCE TO RELATED APPLICATIONS

The present application claims priority of Korean Patent Application No. 10-2014-0174704, filed on Dec. 8, 2014, which is incorporated herein by reference in its entirety.

BACKGROUND

1. Field

This patent document relates to a memory device.

2. Description of the Related Art

Memory devices such as Double Data Rate Synchronous Dynamic Random Access Memory (DDR SDRAM) include a large number of memory cells. With the rapid increase in integration of memory devices, the number of memory cells included in the memory devices has also increased. Such memory cells are arranged to form an array, and the arrays are referred to as cell blocks.

The structure of memory devices may be divided into folded bit line structures and open bit line structures.

The folded bit line structure includes a driving bit line and a reference bit line, which are arranged in the same cell block, based on a bit line sense amplifier arranged in the core region of the memory device. The driving bit line refers to a bit line in which data are driven, and the reference bit line refers to a bit line which serves as a reference during an amplification operation. Thus, since the same noise is reflected in the driving bit line and the reference bit line, noise generated from the driving bit line and the reference bit line may cancel out. Through this cancellation of noise, the folded bit line structure helps support stable device operation. The open bit line structure includes a driving bit line and a reference bit line which are arranged in different cell blocks, based on a bit line sense amplifier. Thus, since noise generated in the driving bit line is different from noise generated in the reference bit line, the open bit line structure is more vulnerable to such noise.

In the folded bit line structure, a unit memory cell is designed to have an $8F^2$ structure, and in the open bit line structure, a unit memory cell is designed to have a $6F^2$ structure. This unit memory cell structure is a factor that determines the size of a memory device. Based on the same data storage capacity, a memory device having the open bit line structure may be designed smaller than a memory device having the folded bit line structure.

Figure 1:
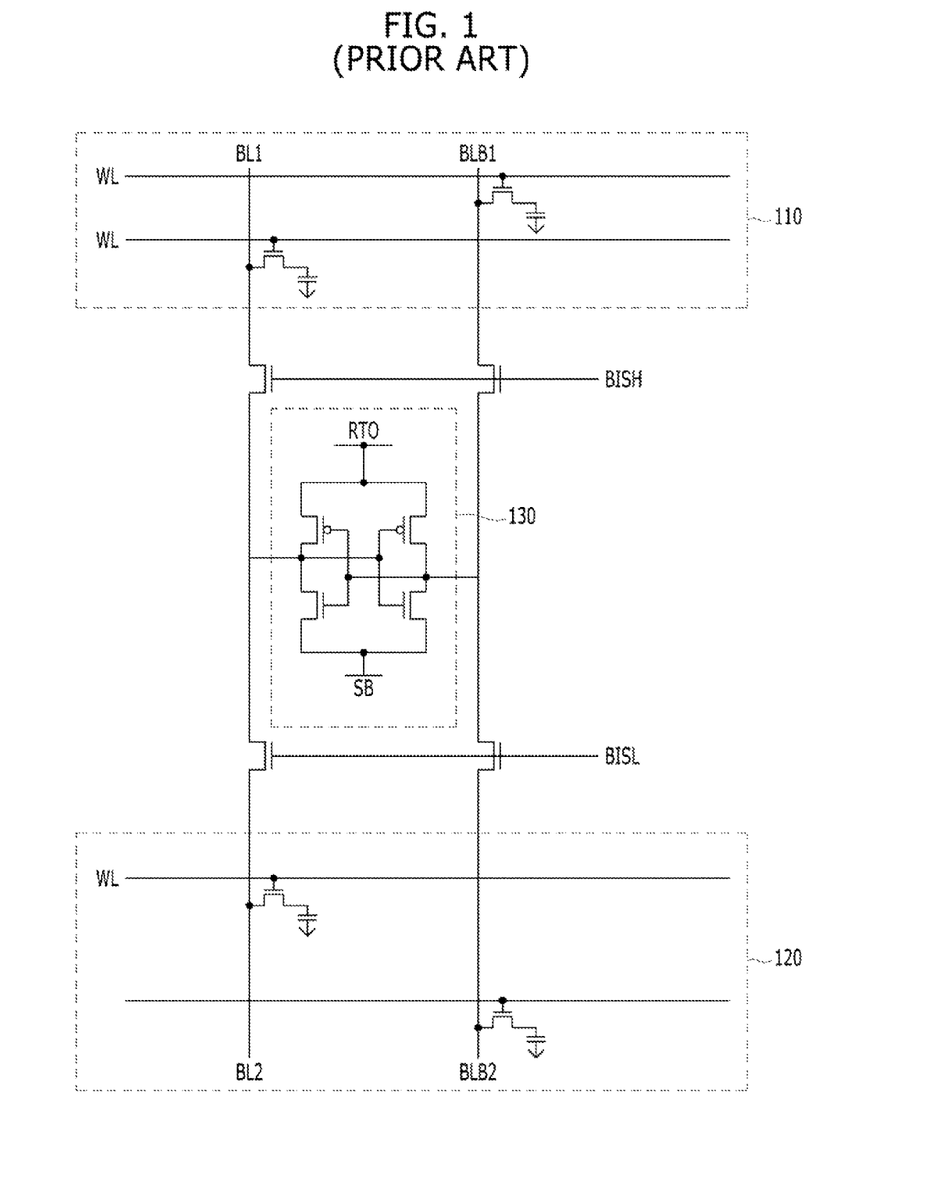
FIG. 1 is a diagram describing a memory device having a folded bit line structure.

FIG. 1 is a diagram describing a memory device having the folded bit line structure.

Referring to FIG. 1, the memory device having the folded bit line structure may include first and second cell blocks 110 and 120 and a sense amplifier 130.

Each of the first and second cell blocks 110 and 120 may include a plurality of memory cell arrays for storing data. The first cell block 110 may include a first bit line and bit line bar BL1 and BLB1, and the second cell block 120 may include a second bit line and bit line bar BL2 and BLB2.

The sense amplifier 130 senses and amplifies voltage levels of the first bit line and bit line bar BL1 and BLB1 or senses and amplifies voltage levels of the second bit line and bit line bar BL2 and BLB2, in response to first and second bit line separation signals BISH and BISL. The sense amplifier 130 includes transistors which are turned on in response to the first and second bit line separation signals BISH and BISL and a latch-type sense amplification circuit which performs a sense amplification operation.

As described above, the folded bit line structure includes a driving bit line and a reference bit line which are arranged in one cell block. For example, when the first bit line separation signal BISH is activated to a logic high level and the second bit line separation signal BISL is deactivated to a logic low level, data is transmitted to the first bit line BL1 or the first bit line bar BLB1 along an activated word line WL. At this time, a bit line to which the data is transmitted becomes the driving bit line, and a bit line paired with the bit line to which the data is transmitted becomes the reference bit line. Then, the sense amplification circuit of the sense amplifier 130 senses the data transmitted through the first bit line and bit line bar BL1 and BLB1, and amplifies the sensed data to voltage levels corresponding to a pull-up power supply voltage RTO and a pull-down power supply voltage SB which are supplied as power to the sense amplification circuit.

Figure 2:
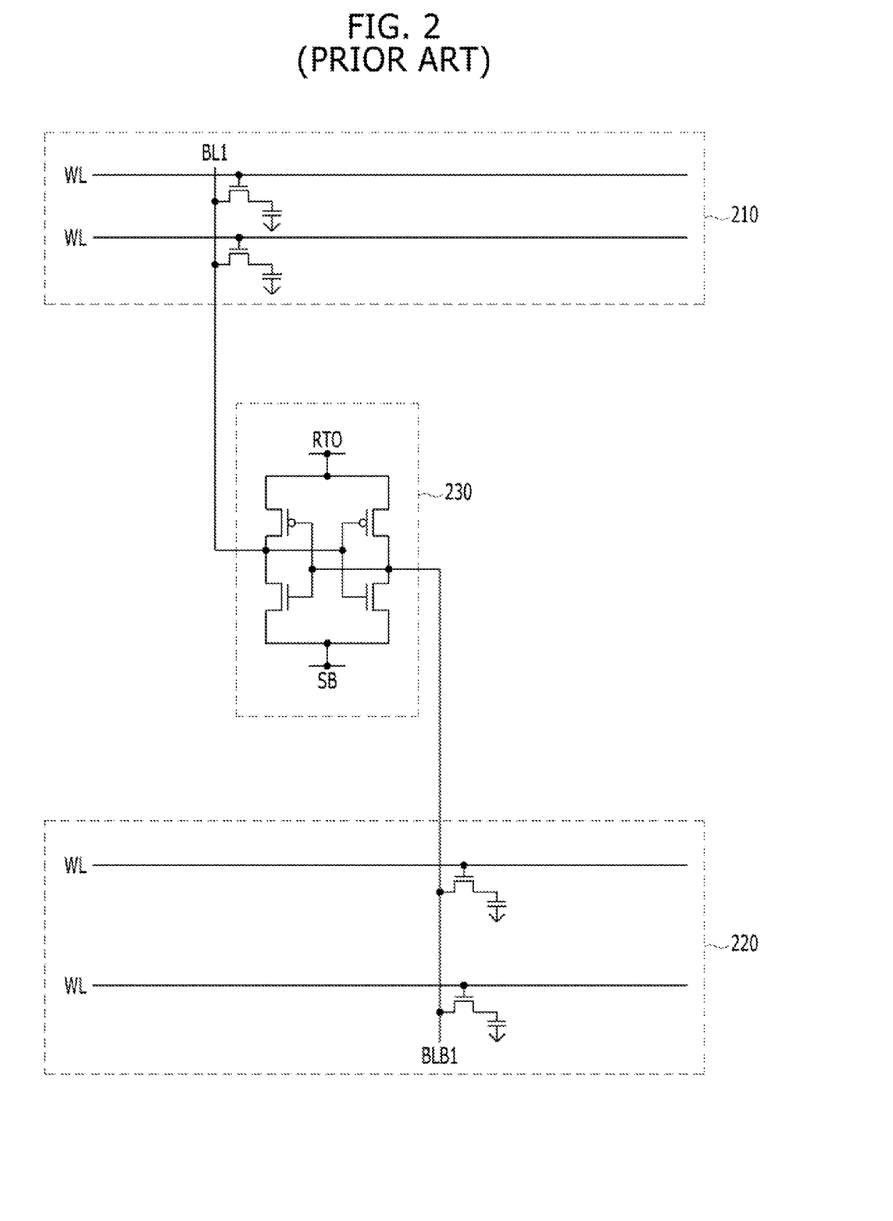
FIG. 2 is a diagram describing a memory device having an open bit line structure.

FIG. 2 is a diagram describing a memory device having the open bit line structure.

Referring to FIG. 2, the memory device having the open bit line structure includes first and second cell blocks 210 and 220 and a sense amplifier 230.

Each of the first and second cell blocks 210 and 220 includes a plurality of memory cell arrays for storing data. The first cell block 210 includes a first bit line BL1 arranged therein, and the second cell block 220 includes a first bit line bar BLB1 arranged therein. The sense amplifier 230 serves to sense and amplify voltage levels of the first bit line and bit line bar BL1 and BLB1. The sense amplifier 230 has the same structure as the sense amplification circuit of FIG. 1.

As described above, the open bit line structure includes a driving bit line arranged in one cell block and a reference bit line arranged in another cell block. For example, when data is driven to the first bit line BL1, the first bit line bar BLB1 arranged in the second cell block 220 becomes the reference bit line, and when data is driven to the first bit line bar BLB1, the first bit line BL1 arranged in the first cell block 210 becomes the reference bit line.

Thus, the open bit line structure does not require additional transistors for separately operating the sense amplifier 230 for the first cell block 210 and the second cell block 220, and the sense amplifier 230 needs only to sense and amplify the voltage levels of the first bit line and bit line bar BL1 and BLB1 according to the activated word line WL.

However, the memory device having the open bit line structure requires minimizing a loading difference of the bit line sense amplifier arranged at the outermost part.

SUMMARY

Various embodiments are directed to a memory device in which the drivability of a bit line sense amplifier arranged at the outermost part of a cell block structure is set to be larger than the drivability of a bit line sense amplifier arranged between cell blocks, thereby minimizing noise due to a loading difference when data of the outermost cell block is amplified.

Also, various embodiments are directed to a memory device which is capable of reducing the area of a cell block structure having an open bit line structure by removing a dummy cell block from the cell block structure.

In an embodiment, a memory device may include: first to Nth cell blocks where N is a natural number greater than 2; first to (N−1)th bit line sense amplifiers, of which a Kth bit line sense amplifier amplifies a potential difference between a bit line of a Kth cell block and a bit line of a (K+1)th cell block, where K is a natural number from 1 to N−1; one or more first outermost bit line sense amplifiers suitable for amplifying a potential difference between a first node and a bit line of the first cell block, wherein drivability for driving the first node is different from drivability for driving the bit line of the first cell block; and one or more second outermost bit line sense amplifiers suitable for amplifying a potential difference between a second node and a bit line of the Nth cell block, wherein drivability for driving the second node is different from drivability for driving the bit line of the Nth cell block.

In an embodiment, a memory device may include: first to Nth cell blocks where N is a natural number greater than 2; first to (N−1)th bit line sense amplifiers, of which a Kth bit line sense amplifier amplifies a potential difference between a bit line of a Kth cell block and a bit line of a (K+1)th cell block where K is a natural number from 1 to N−1; one or more first outermost bit line sense amplifiers suitable for amplifying a potential difference between a first node and a bit line of the first cell block, and including three or more inverters coupled between the first node and the bit line of the first cell block; and one or more second outermost bit line sense amplifiers suitable for amplifying a potential difference between a second node and a bit line of the Nth cell block, and including three or more inverters coupled between the second node and the bit line of the Nth block.

In an embodiment, a memory device may include: a plurality of cell blocks; a plurality of amplification units arranged between two adjacent cell blocks among the plurality of cell blocks and comprising one or more bit line sense amplifiers each suitable for amplifying a potential difference between bit lines of the two adjacent cell blocks; and first and second outermost amplification units respectively arranged in an uppermost part and a lowermost part of the cell blocks, each comprising one or more outermost bit line sense amplifiers each suitable for amplifying a potential difference between a reference node and a bit line of an outermost cell block among the plurality of cell blocks, wherein drivability for driving the reference node is different from drivability for driving the bit line of the outermost cell block.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3A:
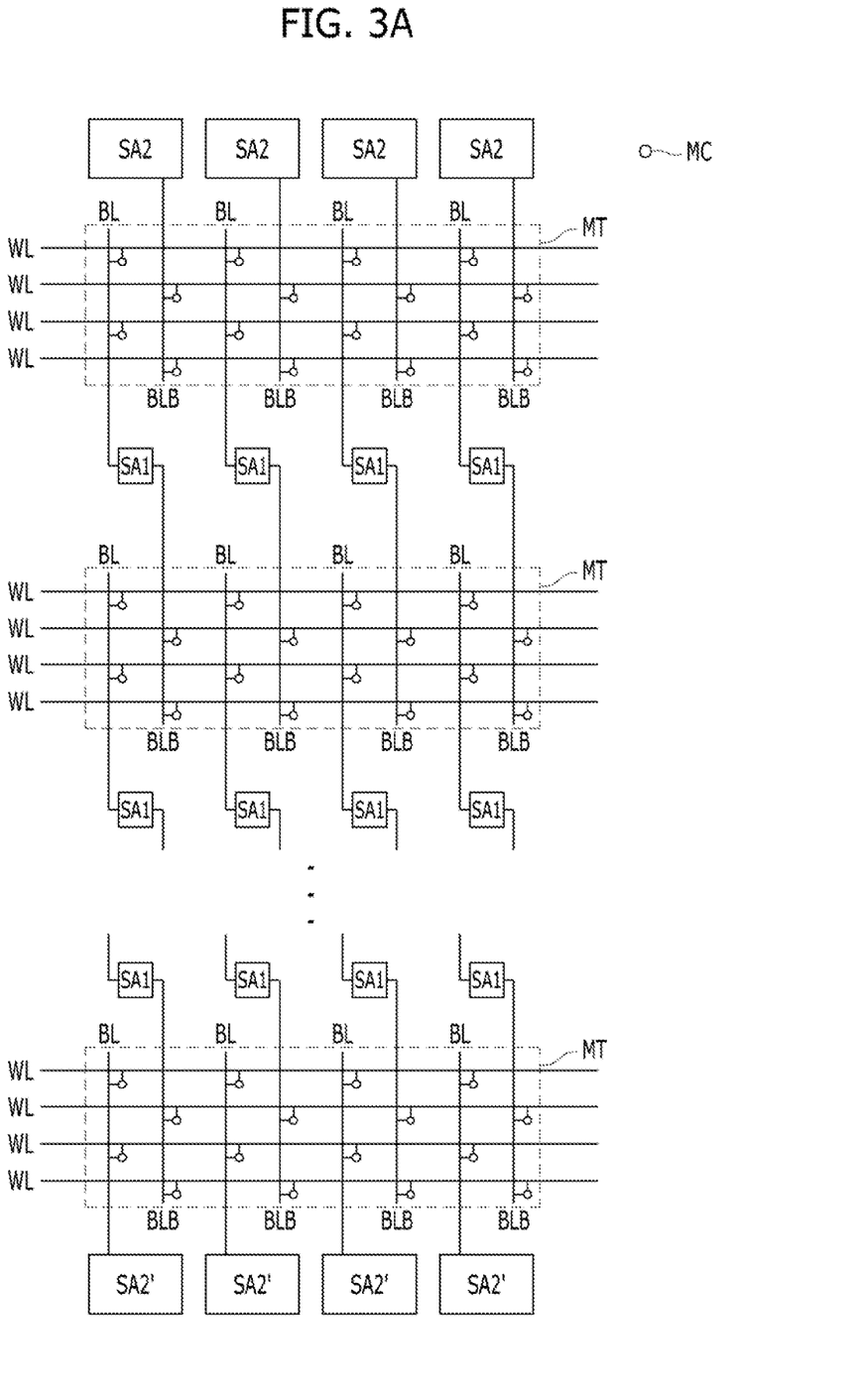
FIG. 3A is a configuration diagram illustrating a memory device having an open bit line structure.

FIG. 3A is a configuration diagram illustrating a memory device having an open bit line structure.

Referring to FIG. 3A, the memory device may include a plurality of cell blocks MT, one or more sense amplifiers SA1 arranged between the respective cell blocks, and one or more sense amplifiers SA2 and SA2' arranged at the outermost parts. Each of the cell blocks MT may include word lines WL, bit lines and bit line bars BL and BLB, and memory cells MC.

Each of the sense amplifiers SA1, SA2, and SA2' may sense and amplify data of a bit line and bit line bar BL and BLB coupled thereto. The sense amplifiers SA1 arranged between the respective cell blocks may be coupled to the bit lines BL of the cell block arranged above the sense amplifiers SA1 and the bit line bars BLB of the cell block arranged below the sense amplifiers SA1. The sense amplifiers SA2 arranged at the uppermost part may be coupled to the bit line bars BLB of the cell block arranged below the sense amplifiers SA2, and the sense amplifiers SA2' arranged at the lowermost part may be coupled to the bit lines BL of the cell block arranged above the sense amplifiers SA2'.

Figure 3B:
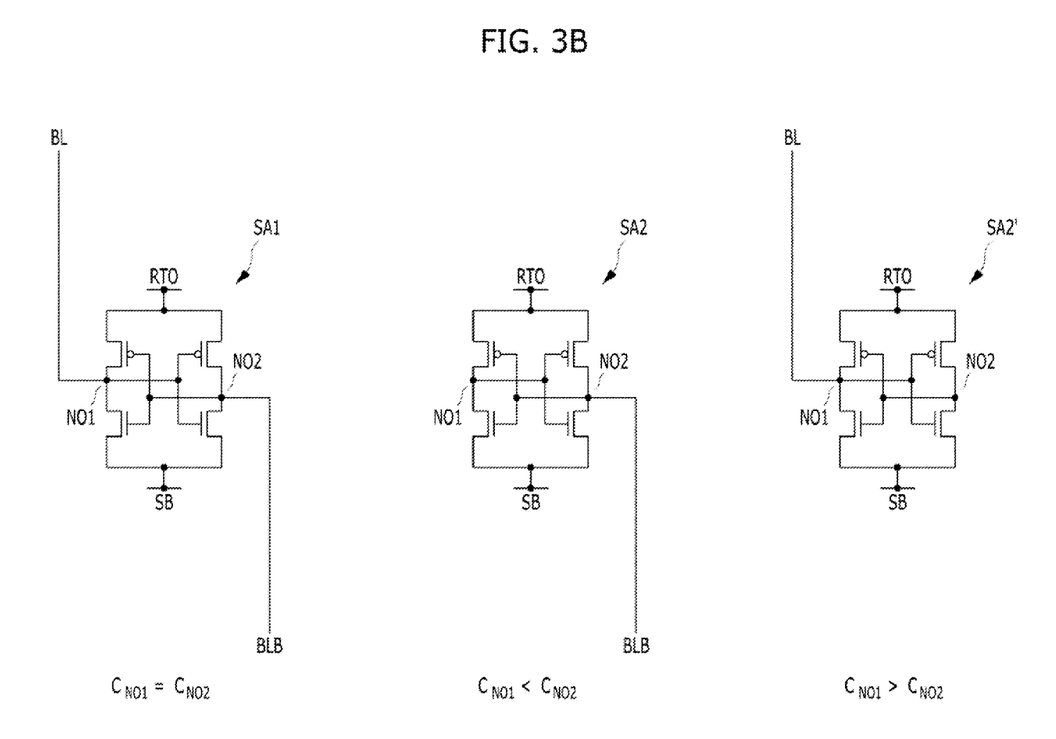
FIG. 3B is a diagram describing sense amplifiers of the memory device illustrated in FIG. 3A.

FIG. 3B is a diagram describing the sense amplifiers SA1, SA2, and SA2' of the memory device illustrated in FIG. 3A.

Referring to FIG. 3B, a bit line BL may be coupled to a node NO1 of the sense amplifier SA1, and a bit line bar BLB may be coupled to a node NO2 of the sense amplifier SA1. Furthermore, no bit line may be coupled to a node NO1 of the sense amplifier SA2, and a bit line bar BLB may be coupled to a node NO2 of the sense amplifier SA2. Furthermore, a bit line BL may be coupled to a node NO1 of the sense amplifier SA2', and no bit line may be coupled to a node NO2 of the sense amplifier SA2'.

Memory cells are coupled to the bit line and bit line bar BL and BLB, respectively. When a word line WL is activated, cell capacitors of the memory cells may be electrically coupled to the bit line and bit line bar BL and BLB, respectively. Thus, the magnitudes of loading capacitances of the nodes NO1 and NO2 may differ depending on parasitic capacitance and whether the bit lines are coupled.

Thus, in the sense amplifier SA1, the loading capacitances of the nodes NO1 and NO2 are equal to each other, i.e., $C_{NO1}=C_{NO2}$. In the sense amplifier SA2, however, the loading capacitance of the node NO1 is smaller than the loading capacitance of the node NO2, $C_{NO1}<C_{NO2}$. Furthermore, the sense amplifier SA2', the loading capacitance of the node NO1 is larger than the loading capacitance of the node NO2, $C_{NO1}>C_{NO2}$. This difference in loading capacitance between the nodes NO1 and NO2 may make the sense amplifiers SA2 and SA2' vulnerable to noise.

Figure 4:
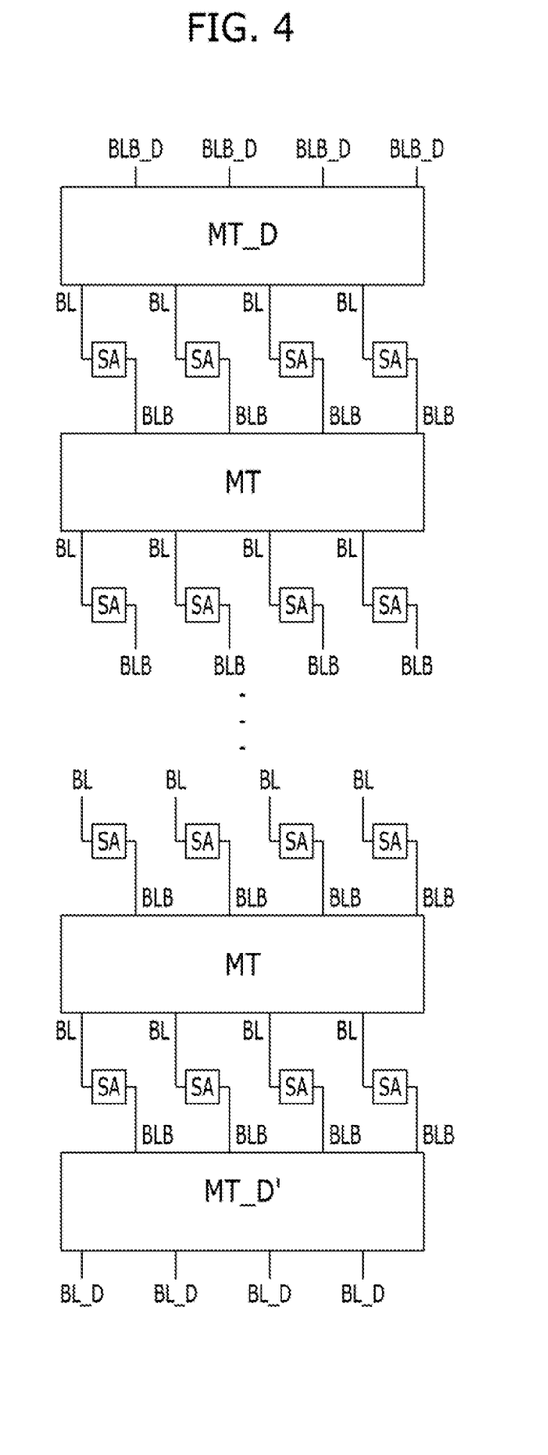
FIG. 4 is a configuration diagram illustrating a memory device in which dummy cell blocks are disposed.

FIG. 4 is a configuration diagram illustrating a memory device in which dummy cell blocks are disposed.

Referring to FIG. 4, the memory device may include a plurality of cell blocks MT, MT_D, and MT_D' and one or more sense amplifiers SA arranged between the respective cell blocks. Each of the cell blocks MT, MT_D, and MT_D' may include word lines WL (not illustrated), bit lines and bit line bars BL and BLB, and memory cells (not illustrated).

Each of the sense amplifiers SA may sense and amplify data of the bit line and bit line bar BL and BLB coupled thereto. The memory device may include the dummy cell blocks MT_D and MT_D' arranged at the outermost parts, instead of sense amplifiers, thereby compensating for the difference in loading capacitance between the first and second nodes NO1 and NO2 of the sense amplifiers of FIG. 3B. Each of the dummy cell blocks MT_D and MT_D' may indicate a cell block in which only one kind of bit line between the bit line and bit line bar BL and BLB is coupled to the sense amplifier SA.

Only the bit lines BL of the dummy cell block MT_D arranged at the uppermost part among the cell blocks MT, MT_D, and MT_D' may be coupled to the sense amplifiers SA, and only the bit line bars BLB of the dummy cell block MT_D' arranged at the lowermost part may be coupled to the sense amplifiers SA. Among the bit lines of the dummy cell blocks MT_D and MT_D', the bit lines BL_D and BLB_D which are not coupled to the sense amplifiers may not be used.

In the memory device of FIG. 4, all of the sense amplifiers SA may be coupled to the bit lines and bit line bars BL and BLB. However, since half of the bit lines and the memory cells of the dummy cell blocks MT_D and MT_D' are not used, the structure does not efficiently utilize its circuit area.

Figure 5:
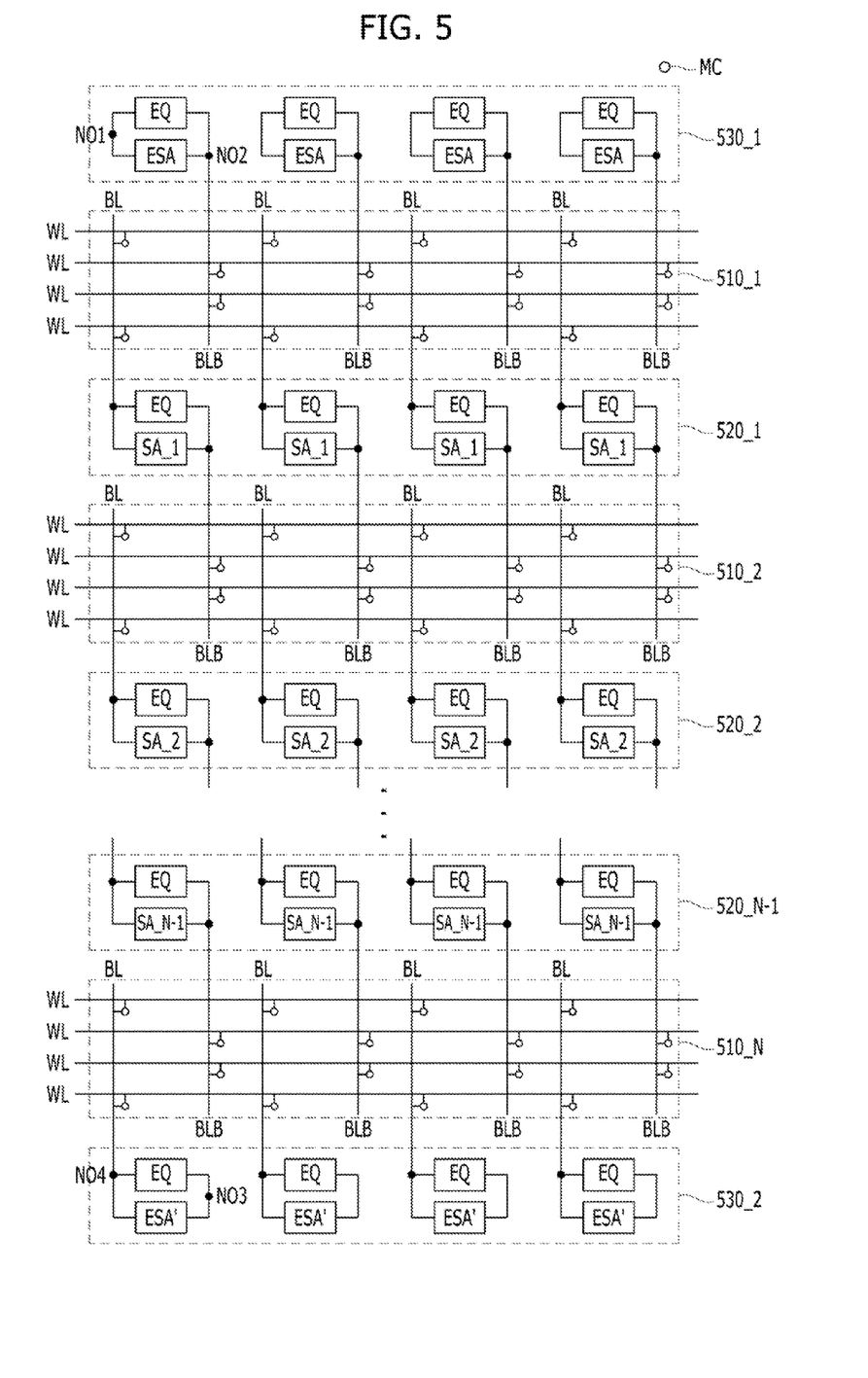
FIG. 5 is a configuration diagram illustrating a semiconductor device in accordance with an embodiment of the present invention.

FIG. 5 is a configuration diagram illustrating a semiconductor device in accordance with an embodiment of the present invention.

Referring to FIG. 5, the semiconductor device may include a plurality of cell blocks 510_1 to 510_N, amplification units 520_1 to 520_N−1 arranged between two adjacent cell blocks, and outermost amplification units 530_1 and 530_2 arranged at the outermost parts, where N is a natural number greater than 2. Each of the cell blocks 510_1 to 510_N may include word lines WL, bit lines and bit line bars BL and BLB, and memory cells MC. The plurality of cell blocks 510_1 to 510_N may have an open bit line structure.

The plurality of cell blocks 510_1 to 510_N may be sequentially arranged, the amplification units 520_1 to 520_N−1 may be arranged between the respective cell blocks, and the outermost amplification units 530_1 and 530_2 may be respectively arranged in an uppermost part and a lowermost part of the cell blocks 510_1 to 510_N, that is, the outermost amplification units 530_1 and 530_2 may be arranged outside the outermost cell blocks 510_1 and 510_N, respectively. Each of the amplification units 520_1 to 520_N−1 may include one or more bit line sense amplifiers SA_1 to SA_N−1, and each of the outermost amplification units 530_1 and 530_2 may include one or more outermost bit line sense amplifiers ESA and ESA'. FIG. 5 illustrates that each of the amplification units includes four bit line sense amplifiers. However, the number of bit line sense amplifiers included in the amplification unit may differ depending on design.

The Kth bit line sense amplifiers SA_K may be arranged between the Kth cell block 510_K and the (K+1)th cell block 510_K+1 where K is a natural number from 1 to N−1, i.e., 1≤K≤N−1. The first outermost bit line sense amplifier ESA may be arranged at the opposite side of the first bit line sense amplifier SA_1 based on the first cell block 510_1, and the second outermost bit line sense amplifier ESA' may be arranged at the opposite side of the (N−1)th bit line sense amplifier SA_N−1 based on the N-th cell block 510_N.

The Kth bit line sense amplifier SA_K may be coupled to the bit line BL of the Kth cell block 510_K and the bit line bar BLB of the (K+1)th cell block 510_K+1, and amplify a potential difference between the bit line and bit line bar BL and BLB coupled thereto.

The first outermost bit line sense amplifier ESA may be coupled to the bit line bar BLB of the first cell block 510_1, and amplify a potential difference between a first node NO1 and the bit line bar BLB of the first cell block 510_1, and drivability for driving the first node NO1 may differ from drivability for driving the bit line bar BLB of the first cell block 510_1.

The second outermost bit line sense amplifier ESA' may be coupled to the bit line BL of the Nth cell block 510_N, and amplify a potential difference between a third node NO3 and the bit line BL of the Nth cell block 510_N, and drivability for driving the third node NO3 may differ from drivability for driving the bit line BL of the Nth cell block 510_N.

Each of the amplification units 520_1 to 520_N−1, 530_1, and 530_2 may further include equalizing units EQ to constantly maintain voltages of the bit lines and bit line bars BL and BLB during a precharge period in which data of the bit lines are not sensed and amplified. The equalizing unit EQ may equalize the voltages of the bit lines and bit line bars BL and BLB to a precharge voltage VBLP during the precharge period.

The bit line sense amplifier will be described below in detail with reference to FIGS. 6 to 8.

The memory device may set the drivabilities of the outermost bit line sense amplifiers ESA and ESA' asymmetrically to the bit line sense amplifiers SA_K, thereby minimizing noise from the outermost bit line sense amplifiers ESA and ESA' due to a difference in loading capacitance. Furthermore, since the memory device may be implemented without using dummy cell blocks, it is possible to reduce the area of the memory device.

Figure 6A:
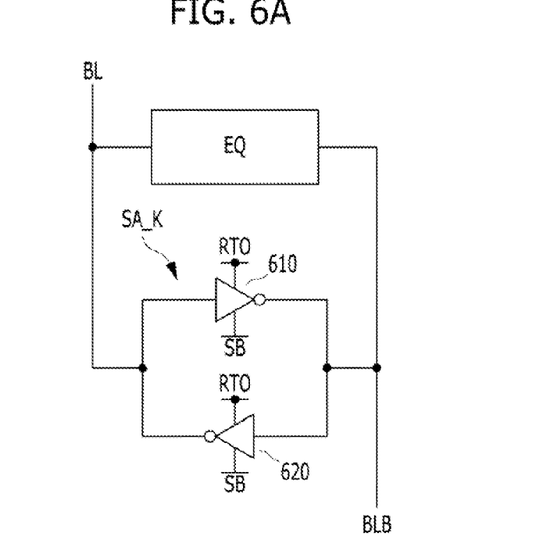
FIGS. 6A and 6B are diagrams illustrating a bit line sense amplifier and an equalizing unit shown in FIG. 5.
Figure 6B:
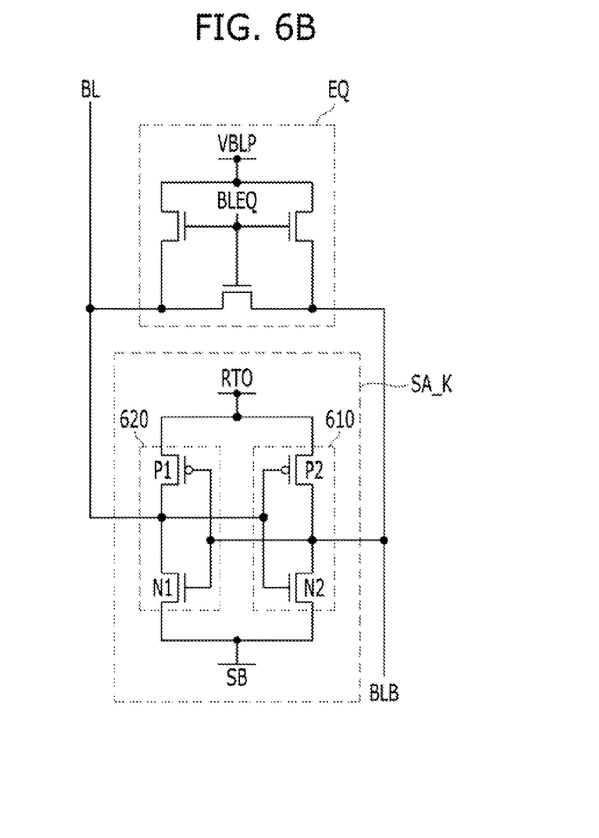

FIGS. 6A and 6B are diagrams illustrating the bit line sense amplifier SA_K and the equalizing unit EQ of FIG. 5. FIG. 6B shows a circuit diagram of the bit line sense amplifier SA_K and the equalizing unit EQ of FIG. 6A.

Referring to FIG. 6A, the bit line sense amplifier SA_K may include inverters 610 and 620. The inverter 610 may have an input terminal coupled to the bit line BL and an output terminal coupled to the bit line bar BLB. The inverter 620 may have an input terminal coupled to the bit line bar BLB and an output terminal coupled to the bit line BL. The inverters 610 and 620 may be activated when a pull-up power supply voltage RTO and a pull-down power supply voltage SB are supplied, and sense and amplify data of the bit line and bit line bar BL and BLB.

In the bit line sense amplifier SA_K, the drivabilities of the inverters 610 and 620 may be equal to each other. In the bit line sense amplifier SA_K, the loading capacitances of the input and output terminals respectively coupled to the bit line and bit line bar BL and BLB may be equal to each other because both the bit line and bit line bar BL and BLB are coupled to the bit line sense amplifier SA_K.

Referring to FIG. 6B, the inverters 610 and 620 may include NMOS transistors N1 and N2 and PMOS transistors P1 and P2, respectively. Further, the equalizing unit EQ may include NMOS transistors which are turned on in response to an equalizing signal BLEQ. The equalizing signal BLEQ may be activated at the precharge period in which data of the bit lines are not sensed and amplified, and deactivated at a period in which the data of the bit lines are sensed and amplified.

Figure 7A:
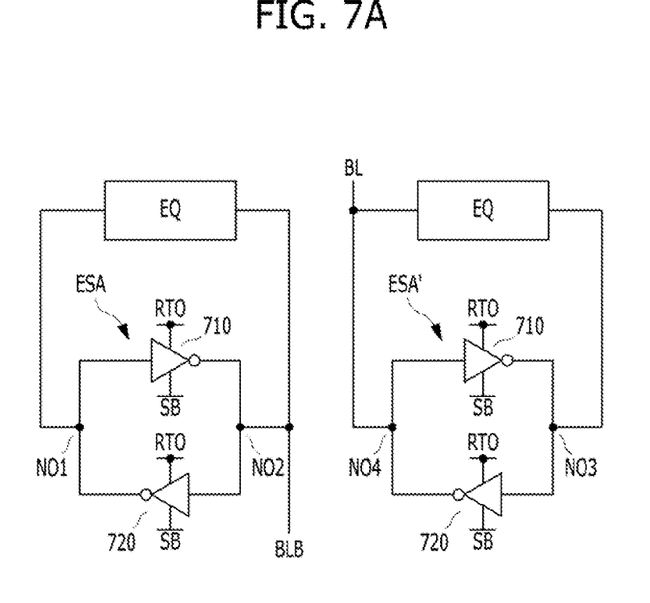
FIGS. 7A and 7B are diagrams illustrating outermost bit line sense amplifiers and equalizing units of FIG. 5 in accordance with an embodiment of the present invention.
Figure 7B:
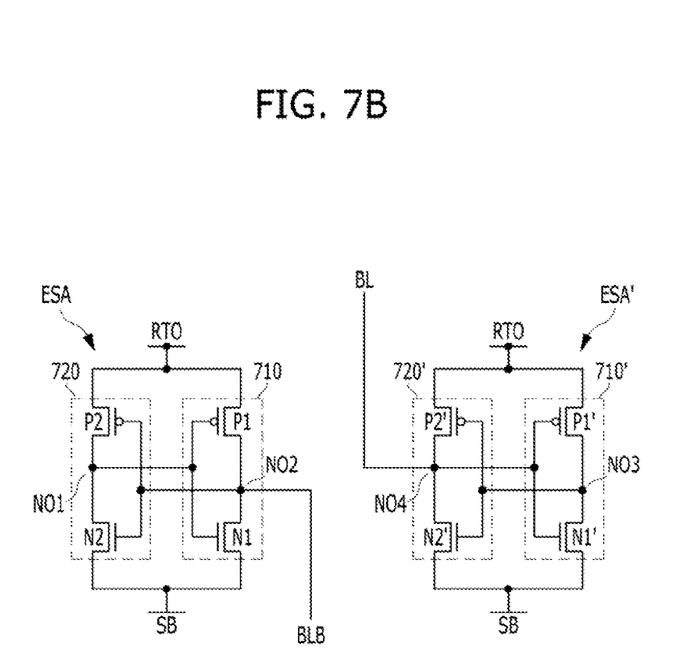

FIGS. 7A and 7B are diagrams illustrating the outermost bit line sense amplifiers ESA and ESA' and the equalizing units EQ of FIG. 5 in accordance with an embodiment of the present invention. FIG. 7B shows a circuit diagram of the outermost bit line sense amplifiers ESA and ESA' of FIG. 7A without the equalizing units EQ.

Referring to FIG. 7A, the outermost bit line sense amplifier ESA may include inverters 710 and 720. The outermost bit line sense amplifier ESA' may include inverters 710' and 720'.

The inverter 710 of the outermost bit line sense amplifier ESA may have an input terminal coupled to the first node NO1 and an output terminal coupled to the bit line bar BLB of the cell block 510_1 through a second node NO2. Furthermore, the inverter 720 may have an input terminal coupled to the bit line bar BLB of the cell block 510_1 through the second node NO2, and an output terminal coupled to the first node NO1. The inverters 710 and 720 may be activated when the pull-up power supply voltage RTO and the pull-down power supply voltage SB are supplied, and sense and amplify data of the bit line and bit line bar BL and BLB.

In a first embodiment, the drivability of the inverter 710 may be set to be larger than the drivability of the inverter 720. As the drivability of the inverter gets larger, the inverter becomes more rapidly charged or discharged. That is, the inverter 710 may be charged or discharged more rapidly than the inverter 720.

In the outermost bit line sense amplifier ESA, the loading capacitance of the second node NO2 coupled to the bit line bar BLB may be larger than the loading capacitance of the first node NO1. When the drivability of the inverter 710 is set to be larger than the drivability of the inverter 720, the speed at which the second node NO2 is charged or discharged may become higher than the speed at which the first node NO1 is charged or discharged. Thus, a difference in the loading capacitance between the first and second nodes NO1 and NO2 may be cancelled.

In a second embodiment, the drivability of the inverter 720 may be set to be larger than the drivability of the inverter 710. In this case, as the inverter 720 having a large drivability is used to drive the first node NO1 having a small loading capacitance, a voltage of the first node NO1 may be rapidly changed.

Referring to FIG. 7B, the inverters 710 and 720 may include NMOS transistors N1 and N2 and PMOS transistors P1 and P2, respectively. In the first embodiment, as the size of the transistors N1 and P1 included in the inverter 710 is designed to be larger than the size of the transistors N2 and P2 included in the inverter 720, the drivability of the inverter 710 may be set to be larger than the drivability of the inverter 720. In the second embodiment, as the size of the transistors N2 and P2 included in the inverter 720 is designed to be larger than the size of the transistors N1 and P1 included in the inverter 710, the drivability of the inverter 720 may be set to be larger than the drivability of the inverter 710.

Referring to FIG. 7A, the inverter 720' of the outermost bit line sense amplifier ESA' may have an input terminal coupled to the third node NO3 and an output terminal coupled to the bit line BL of the cell block 510_N through a fourth node NO4. Furthermore, the inverter 710' may have an input terminal coupled to the bit line BL of the cell block 510_N through the fourth node NO4, and an output terminal coupled to the third node NO3. The inverters 710' and 720' may be activated when the pull-up power supply voltage RTO and the pull-down power supply voltage SB are supplied, and sense and amplify data of the bit line and bit line bar BL and BLB.

Referring to FIG. 7B, the inverter 710' may include transistors P1' and N1', and the inverter 720' may include transistors P2' and N2'. In the first embodiment, the size of the transistors P2' and N2' may be larger than the size of the transistors P1' and N1'. In the second embodiment, the size of the transistors P1' and N1' may be larger than the size of the transistors P2' and N2'.

Figure 8A:
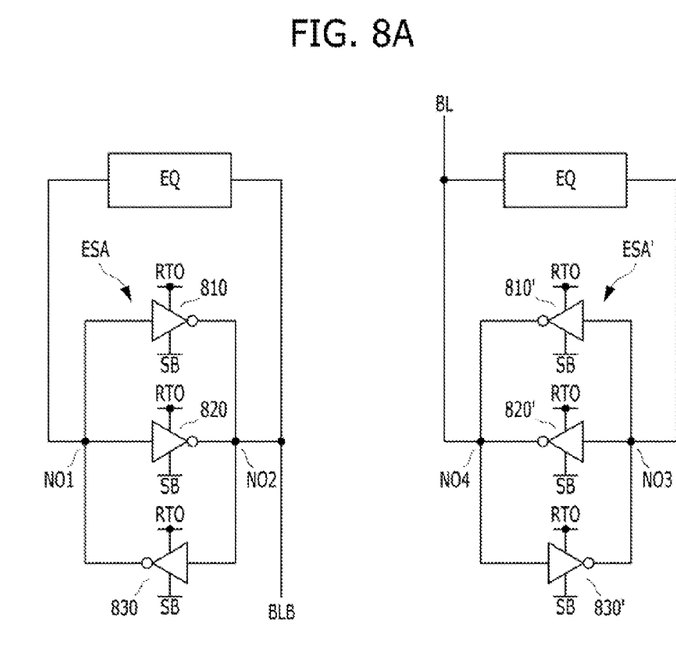
FIGS. 8A and 8B are diagrams illustrating outermost bit line sense amplifiers and equalizing units of FIG. 5 in accordance with an embodiment of the present invention.
Figure 8B:
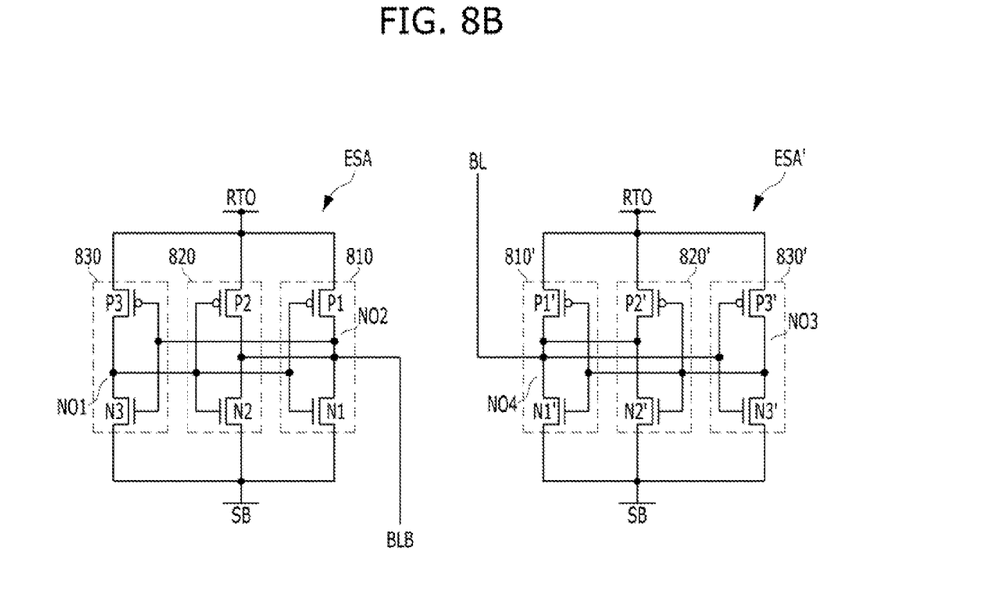

FIGS. 8A and 8B are diagrams illustrating the outermost bit line sense amplifiers ESA and ESA' and the equalizing units EQ of FIG. 5 in accordance with an embodiment of the present invention. FIG. 8B shows a circuit diagram of the outermost bit line sense amplifiers ESA and ESA' of FIG. 8A without the equalizing units EQ.

Referring to FIG. 8A, the outermost bit line sense amplifier ESA may include inverters 810, 820, and 830. The outermost bit line sense amplifier ESA' may include inverters 810', 820', and 830'.

The inverters 810 and 820 of the outermost bit line sense amplifier ESA may have an input terminal coupled to the first node NO1 and an output terminal coupled to the bit line bar BLB of the cell block 510_1 through a second node NO2. The inverter 830 may have an input terminal coupled to the bit line bar BLB of the cell block 510_1 through the second node NO2, and an output terminal coupled to the first node NO1. The inverters 810, 820, and 830 may be activated when the pull-up power supply voltage RTO and the pull-down power supply voltage SB are supplied, and sense and amplify data of the bit line and bit line bar BL and BLB.

Since the two inverters 810 and 820 drive the bit line bar BLB of the cell block 510_1 and the one inverter 830 drives the first node NO1, the drivability for driving the bit line bar BLB may be larger than the drivability for driving the first node NO1 when it is assumed that each inverter has the same drivability. Thus, as described in the first embodiment of FIG. 7A, a difference in loading capacitance between the first node NO1 and the second node NO2 coupled to the bit line bar BLB may be cancelled.

Referring to FIG. 88B, the inverters 810, 820, and 830 may include NMOS transistors N1, N2, and N3 and PMOS transistors P1, P2, and P3, respectively. The capacitances existing in gates of the transistors N2 and P2 included in the inverter 820 may generate an effect of increasing the loading capacitance of the first node NO1. The gate capacitances of the transistors N2 and P2 included in the inverter 820 may be added to the first node NO1 having the smaller loading capacitance between the first and second nodes NO1 and NO2, thereby compensating for the difference in the loading capacitance between the first and second nodes NO1 and NO2.

Referring to FIG. 8A, the inverters 810' and 820' of the outermost bit line sense amplifier ESA' may have an input terminal coupled to the third node NO3 and an output terminal coupled to the bit line BL of the cell block 510_N through a fourth node NO4. The Inverter 830' may have an input terminal coupled to the bit line BL of the cell block 510_N through the fourth node NO4, and an output terminal coupled to the third node NO3.

Referring to FIG. 8B, the inverters 810', 820', and 830' may include NMOS transistors N1', N2', and N3' and PMOS transistors P1', P2', and P3', respectively. The capacitances existing in gates of the transistors N2' and P2' included in the inverter 820' may generate an effect of increasing the loading capacitance of the third node NO3.

Figure 9A:
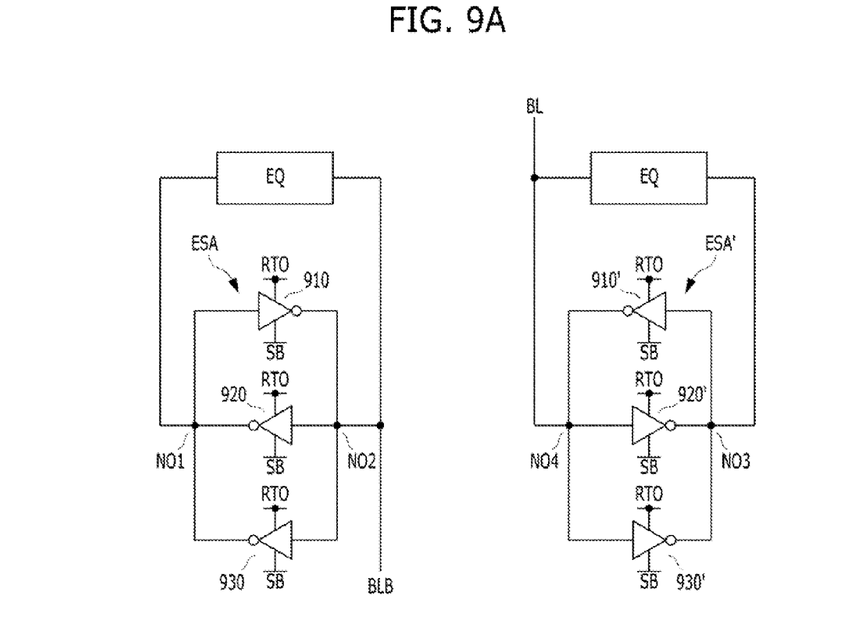
FIGS. 9A and 9B are diagrams illustrating outermost bit line sense amplifiers and equalizing units of FIG. 5 in accordance with an embodiment of the present invention.
Figure 9B:
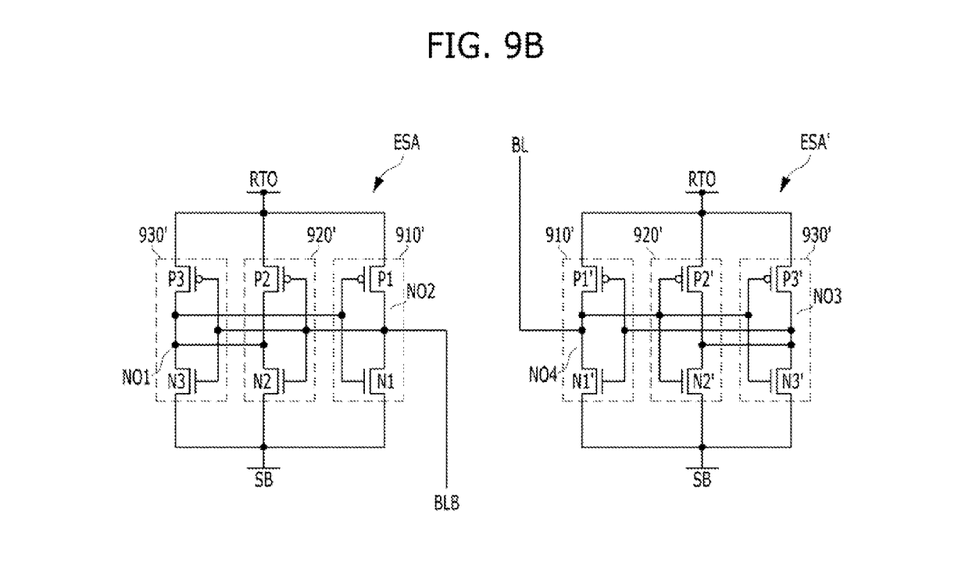

FIGS. 9A and 9B are diagrams illustrating the outermost bit line sense amplifiers ESA and ESA' and the equalizing units EQ of FIG. 5 in accordance with an embodiment of the present invention. FIG. 9B shows a circuit diagram of the outermost bit line sense amplifiers ESA and ESA' of FIG. 9A without the equalizing units EQ.

Referring to FIG. 9A, the outermost bit line sense amplifier ESA may include inverters 910, 920, and 930. The outermost bit line sense amplifier ESA' may include inverters 910', 920', and 930'.

The inverter 910 of the outermost bit line sense amplifier ESA may have an input terminal coupled to the first node NO1 and an output terminal coupled to the bit line bar BLB of the cell block 510_1 through a second node NO2. The inverters 920 and 930 may have an input terminal coupled to the bit line bar BLB of the cell block 510_1 through the second node NO2, and an output terminal coupled to the first node NO1. The inverters 910, 920, and 930 may be activated when the pull-up power supply voltage RTO and the pull-down power supply voltage SB are supplied, and sense and amplify data of the bit line and bit line bar BL and BLB.

Since the one inverter 910 drives the bit line bar BLB of the cell block 510_1 and the two inverters 920 and 930 drive the first reference node NO1, the drivability for driving the first reference node NO1 may be greater than the drivability for driving the bit line bar BLB when it is assumed that each inverter has the same drivability. Thus, as the first node NO1 having a small loading capacitance is strongly driven, as described in the second embodiment of FIG. 7A, the voltage of the first reference node NO1 may be rapidly changed.

Referring to FIG. 9B, the inverters 910, 920, and 930 may include NMOS transistors N1, N2, and N3 and PMOS transistors P1, P2, and P3, respectively.

Referring to FIG. 9A, the inverter 910' of the outermost bit line sense amplifier ESA' may have an input terminal coupled to the second node NO2 and an output terminal coupled to the bit line BL of the cell block 510_N. The inverter 920' and 930' may have an input terminal coupled to the bit line BL of the cell block 510_N and an output terminal coupled to the second node NO2.

Referring to FIG. 9B, the inverters 910', 920', and 930' may include NMOS transistors N1', N2', and N3' and PMOS transistors P1', P2', and P3', respectively.

The memory device may set the drivability for driving a node which is coupled to a bit line differently, and thus has a large loading capacitance, from the drivability for driving a node which is not coupled to a bit line, and thus has a small loading capacitance, thereby compensating for a difference in loading capacitance between the two nodes.

In order to set the drivabilities differently, the size of transistors to drive the node coupled to the bit line may be different from the size of transistors to drive the node which is not coupled to the bit line. Alternatively, the number of inverters to drive the node coupled to the bit line may be different from the number of inverters to drive the node which is not coupled to the bit line.

By increasing the number of inverters to drive the node coupled to the bit line, the transistors included in the inverter may increase the loading capacitance of the node which is not coupled to the bit line, thereby compensating for the difference in the loading capacitance between the two nodes.

Since the memory device includes no dummy cell array, it is possible to compensate for a difference in loading capacitance between two nodes in the bit line sense amplifier while reducing the area of the memory device.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
   first to Nth cell blocks where N is a natural number greater than 2;
   first to (N−1)th bit line sense amplifiers, of which a Kth bit line sense amplifier amplifies a potential difference between a bit line of a Kth cell block and a bit line of a (K+1)th cell block, where K is a natural number from 1 to N−1;
   one or more first outermost bit line sense amplifiers suitable for amplifying a potential difference between a first node and a bit line of the first cell block, wherein the one or more first outermost bit line sense amplifiers drive the first node with a first drivability and drive the bit line of the first cell block with a second drivability which is different from the first drivability; and
   one or more second outermost bit line sense amplifiers suitable for amplifying a potential difference between a second node and a bit line of the Nth cell block, wherein the one or more second outer most bit line sense amplifiers drive the second node with the first drivability and drive the bit line of the Nth cell block with the second drivability,
   wherein the first outermost bit line sense amplifier comprises:
      two or more first inverters having an input terminal coupled to the first node and an output terminal coupled to the bit line of the first cell block; and
      one or more second inverters having an input terminal coupled to the bit line of the first cell block and an output terminal coupled to the first node, wherein the number of the first inverters is greater than the number of the second inverters, and the second outermost bit line sense amplifier comprises:
      two or more third inverters having an input terminal coupled to the second node and an output terminal coupled to the bit line of the Nth cell block; and
      one or more fourth inverters having an input terminal coupled to the bit line of the Nth cell block and an output terminal coupled to the second node, wherein the number of the third inverters is greater than the number of the fourth inverters.

2. The memory device of claim 1, wherein the first to Nth cell blocks have an open bit line structure.

3. The memory device of claim 1, wherein the first to Nth cell blocks are sequentially arranged,
   the Kth bit line sense amplifier is arranged between the Kth cell block and the (K+1)th cell block,
   the first outermost bit line sense amplifier is arranged at the opposite side of the first bit line sense amplifier based on the first cell block, and
   the second outermost bit line sense amplifier is arranged at the opposite side of the (N−1)th bit line sense amplifier based on the Nth cell block.

4. The memory device of claim 1, wherein the first outermost bit line sense amplifier drives the first node and the bit line of the first cell block in response to the potential difference between the first node and the bit line of the first cell block, and
   the second outermost bit line sense amplifier drives the second node and the bit line of the Nth cell block in response to the potential difference between the second node and the bit line of the Nth cell block, wherein the second drivability is greater than the first drivability.

5. A memory device comprising:
first to Nth cell blocks where N is a natural number greater than 2;
first to (N−1)th bit line sense amplifiers, of which a Kth bit line sense amplifier amplifies a potential difference between a bit line of a Kth cell block and a bit line of a (K+1)th cell block, where K is a natural number from 1 to N−1;
one or more first outermost bit line sense amplifiers suitable for amplifying a potential difference between a first node and a bit line of the first cell block, and comprising one or more first inverters for driving the first node and one or more second inverters for the bit line of the first cell block, wherein the number of the first inverters is different from the number of the second inverters; and
one or more second outermost bit line sense amplifiers suitable for amplifying a potential difference between a second node and a bit line of the Nth cell block, and comprising one or more third inverters for driving the second node and one or more fourth inverters for the bit line of the Nth cell block, wherein the number of the third inverters is different from the number of the fourth inverters.

6. The memory device of claim 5, wherein the first to Nth cell blocks have an open bit line structure.

7. The memory device of claim 5, wherein the first to Nth cell blocks are sequentially arranged,
the Kth bit line sense amplifier is arranged between the Kth cell block and the (K+1)th cell block,
the first outermost bit line sense amplifier is arranged at the opposite side of the first bit line sense amplifier based on the first cell block, and
the second outermost bit line sense amplifier is arranged at the opposite side of the Nth bit line sense amplifier based on the Nth cell block.

8. The memory device of claim 5, wherein the number of the first inverters is greater than the number of the second inverters, and
the number of the third inverters is greater than the number of the fourth inverters.

9. The memory device of claim 5, wherein the number of the second inverters is greater than the number of the first inverters, and the number of the fourth inverters is greater than the number of the third inverters.

10. A memory device comprising:
a plurality of cell blocks;
a plurality of amplification units arranged between two adjacent cell blocks among the plurality of cell blocks and comprising one or more bit line sense amplifiers each suitable for amplifying a potential difference between bit lines of the two adjacent cell blocks; and
first and second outermost amplification units respectively arranged in an uppermost part and a lowermost part of the cell blocks, each comprising one or more outermost bit line sense amplifiers and each suitable for amplifying a potential difference between a reference node and a bit line of an outermost cell block among the plurality of cell blocks, wherein the first and second outermost bit line sense amplifiers drive the reference node with a first drivability and drive the bit line of the outermost cell block with a second drivability which is different from the first drivability,
wherein the outermost bit line sense amplifier comprises:
two or more first inverters having an input terminal coupled to the reference node and an output terminal coupled to the bit line of the outermost cell block; and
one or more second inverters having an input terminal coupled to the bit line of the outermost cell block and an output terminal coupled to the reference node, wherein the number of the first inverters is greater than the number of the second inverters.

11. The memory device of claim 10, wherein the plurality of cell blocks have an open bit line structure.

12. The memory device of claim 10, wherein the outermost bit line sense amplifier drives the reference node and the bit line of the outermost cell block in response to the potential difference between the reference node and the bit line of the outermost cell block, wherein the second drivability is greater than the first drivability.

13. The memory device of claim 10, wherein the outermost bit line sense amplifier drives the reference node and the bit line of the outermost cell block in response to the potential difference between the reference node and the bit line of the outermost cell block, wherein the first drivability is greater than the second drivability.

* * * * *